United States Patent [19]

Dias

[11] 3,713,048

[45] Jan. 23, 1973

[54] SWIF'S WITH SPECIAL POLARIZATION FOR NON-LINEAR INTERACTIONS

[75] Inventor: Fleming Dias, Palo Alto, Calif.

[73] Assignee: Zenith Radio Corporation, Chicago, Ill.

[22] Filed: July 28, 1971

[21] Appl. No.: 166,794

[52] U.S. Cl. ..................332/52, 321/69 NL, 330/4.6, 330/5.5

[51] Int. Cl. .........H03c 1/46, H03f 7/00, H02m 5/06

[58] Field of Search ...............330/5.5, 4.6; 302/88.3; 321/69; 332/52

[56] References Cited

UNITED STATES PATENTS 3,614,463 10/1971 Slobodnik ............................330/5.5

OTHER PUBLICATIONS

Chao, "Applied Physics Letters," 15 May 1970, p. 399–401.

Lean et al., "Applied Physics Letters," 1 Jan. 1970, p. 32–35.

Fang et al., "IBM Technical Disclosure Bulletin," April 1971, p. 3487.

*Primary Examiner*—Roy Lake
*Assistant Examiner*—Darwin R. Hostetter
*Attorney*—Francis W. Crotty

[57] ABSTRACT

A medium of piezoelectric material has a surface upon which acoustic waves may be propagated. One portion of that medium exhibits non-linearity of interaction between stress components and associated electric field components. An input transducer disposed on that portion responds to an electric signal of predetermined frequency to produce stress components at a frequency twice that of the electric field developed by the input signal. These stress components result in acoustic energy which propagates as a surface wave of twice the input signal frequency. Finally, an output transducer is coupled to a linearly interacting portion of the medium and responds to the acoustic energy for developing an output signal. Without more, the device may function as a frequency doubler. With the addition of further apparatus to couple another input signal to the medium, the device may function as a modulator or other apparatus in which two signals co-act.

18 Claims, 3 Drawing Figures

Inventor
Fleming Dias
By Francis W. Crotty
Attorney

SWIF'S WITH SPECIAL POLARIZATION FOR NON-LINEAR INTERACTIONS

BACKGROUND OF THE INVENTION

The present invention relates to acoustic-wave signal-translating devices. More particularly, it pertains to such devices that operate as modulators, frequency doublers, and the like.

To the end of providing selectivity of a program carrier in the signal transmission channels of television receivers and in other systems, the copending application of Adrian DeVries, Ser. No. 721,038, filed Apr. 12, 1968, and assigned to the same assignee as the present application, discloses and claims a variety of devices in which transducers interact with acoustic surface waves propagated on a substrate. By appropriate selection of the propagating material and design of the transducers, a wide variety of different selectivity characteristics may be obtained. These acoustic-wave devices may be fabricated entirely with integrated-circuit techniques and their overall sizes at television frequencies involve but fractions of an inch. Consequently, they lend themselves admirably to combination with other active and passive elements as portions of a completely-integrated solid-state system.

Because of its nature, such a device has been denoted as a surface-wave intergratable filter and, for convenience, has come to be known by the abbreviation SWIF. In a typical SWIF, a transducer having an electrode array composed of interleaved combs of conductive teeth at alternating electric potentials, when coupled to a wave-propagating medium, produces acoustic surface waves on the medium. A similar transducer responds to those waves to develop an output signal. Selectivity may be achieved in both transducers, thereby eliminating the need for the much larger and more cumbersome components normally associated with selective circuitry.

As discussed in the aforementioned copending application, numerous modifications and alternations, particularly upon the transducers employed, enable tailoring of the frequency response characteristic more or less as desired. Additionally, by reason of the finite time of wave travel between input and output transducers, such devices exhibit a controllable amount of time delay in the transmission of the signals between the transducers.

As such, SWIFs have been strictly passive devices. By reason of their capability of being integrated in solid-state form with other devices, it has been contemplated to deposit them on substrates alongside active devices such as transistors to achieve the solid-state formation of complete systems. It has also been suggested to propagate acoustic waves alongside travelling charge carriers that drift at a velocity slightly higher than the propagation velocity of the acoustic waves as a result of which energy is delivered from the charge carriers to the acoustic waves and the latter are amplified. Such a combination thus becomes a king of travelling-wave amplifier. Utilizing separate but integrally associated and interconnected active devices, acoustic filters and/or delay devices may be part of systems that achieve other functions such as amplification, modulation and frequency multiplication.

SUMMARY OF THE INVENTION

It is a general object of the present invention to provide a new and improved acoustic surface wave signal translating device which functions as a modulator and/or frequency multiplier.

It is another object of the present invention to provide a new and improved acoustic surface wave device that passively functions like an active element.

An acoustic-wave signal-translating device constructed in accordance with the present invention includes a medium propagative of acoustic surface waves and which includes a first portion exhibiting non-linearity of interaction between stress components and associated electric field components. Coupled to that portion of the medium is an input transducer which responds to an electric signal for developing fields in the medium that create associated non-linearly related stress components in the form of acoustic surface waves. Finally, the device includes an output transducer coupled to a linearly interacting second portion of the medium and which responds to the acoustic waves for developing an output signal.

BRIEF DESCRIPTION OF THE DRAWING

The features of the present invention which are believed to be novel are set forth with particularity in the appended claims. The organization and manner of operation of the invention, together with further objects and advantages thereof, may best be understood by reference to the following description taken in connection with the accompanying drawing, in the several figures of which like reference numerals identify like elements and in which:

DESCRIPTION OF THE PREFERRED EMBODIMENT

Figure 1:
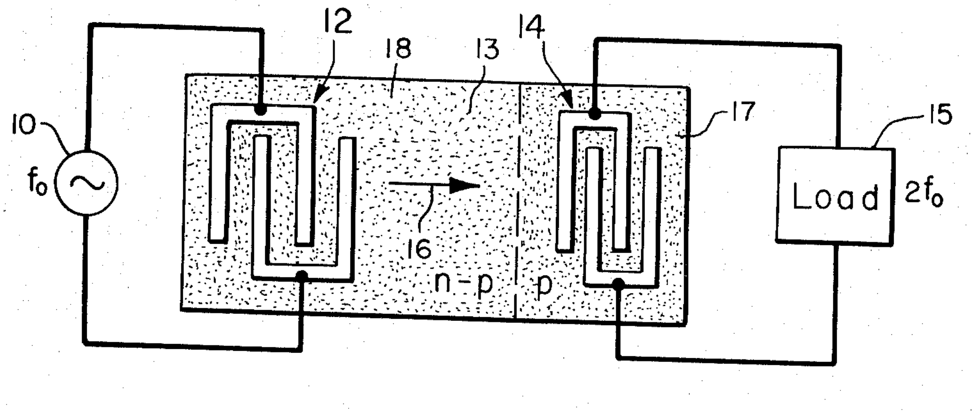
FIG. 1 is a partly schematic plan view of an acoustic-wave signal-translating device.

In FIG. 1, a signal source 10 is connected across an input transducer 12 coupled to one major surface of an acoustic-wave propagative medium shown as a substrate 13. As specifically embodied herein the acoustic-wave energy is propagated in the form of surface waves. Accordingly, an output or second portion of the same surface of substrate 13 is mechanically coupled to an output transducer 14 across which a load 15 is coupled.

In the simplest version of a surface wave integratable filter shown in the aforementioned copending application, the input and output transducers are identical. In the embodiments presently to be disclosed, the input and output transducers are different. As shown in FIG. 1, transducers 12 and 14 are similar but involve a difference in interelectrode spacings. In any event, the illustrated form of transducers are each constructed of two comb-type electrode arrays. The conductive teeth of one comb are interleaved with the teeth of the other. The combs are of a material, such as gold or aluminum, which may be vacuum deposited on a smoothly-lapped and polished planar surface of a body the properties of which include that of being piezoelectric. The piezoelectric is one, such as PZT or lithium niobate, that propagates acoustic surface waves. While the material has other properties to be discussed further, at the moment it is necessary only to consider its piezoelectric characteristic.

Direct piezoelectric surface-wave transduction is accomplished by the spatially periodic interdigital electrodes or teeth of transducer 12. A periodic electric field is produced when a signal from source 10 is fed to the teeth and, through piezoelectric coupling, the signal energy is transduced to a travelling acoustic wave on substrate 13. This occurs when the stress components produced by the electric field in the substrate are substantially matched to the stress components associated with the surface-wave mode. Source 10 may produce a range of signal frequencies, but, due to the selective nature of the arrangement, only a particular frequency and its intelligence carrying sidebands are converted to surface waves. Those surface waves are transmitted along the substrate to output transducer 14 where they are converted to an electrical signal for application to load 15.

In a typical embodiment, utilizing a lithium niobate substrate, the teeth of transducer 12 are each about eight microns wide and are separated by a spacing of 8 microns for the application of a radio-frequency signal at 211.25 MHz. The spacing between transducer 12 and 14 is on the order of 60 mils and the width of the wavefront is approximately 0.1 inch.

The potential developed between any given pair of successive teeth in electrode array 12 produces two waves travelling along the surface of substrate 13 in opposing directions. In various arrangements disclosed in the aforementioned copending application, both of those waves are utilized. In other arrangements, also discussed therein, one of the waves is instead either absorbed in an appropriate terminating medium or surface or is properly reflected so as to pass back through the transducer with an appropriate phase relationship so as to augment the wave energy originally travelling in the other direction. While such modifications or other arrangements may be employed in the present case, for simplicity of illustration the waves travelling to the left of transducer 12 in FIG. 1 are ignored and only the waves travelling to the right, indicated by the arrow 16, are considered.

When the center-to-center distance between the teeth of transducer 12 is one-half the acoustic wavelength at the desired input frequency, relative maxima of the acoustic waves in the region of arrow 16 are obtained. Similarly, when the center-to-center distance between the teeth in output transducer 14 is one-half of the acoustic wavelength of the waves approaching that transducer from the region indicated by arrow 16, a relative maxima of the electrical signals fed to load 15 is obtained by piezoelectric transduction in transducer 14. For increased selectivity, additional electrode teeth are added to the comb patterns of transducers 12 and 14. Further modifications and adjustments are described and others are cross-referenced in the aforementioned copending application for the purpose of particularly shaping the response presented by the device to the transmitted signal.

It has been indicated that the spacing of the teeth is directly a function of the frequency of the signals to be translated, and hence also directly a function of the corresponding acoustic wavelengths in the medium. In the device of FIG. 1, those inter-tooth spacings are different as between input transducer 12 and output transducer 14. Specifically, the inter-tooth spacing of transducer 14 is one-half that of transducer 12 so that transducer 14 responds to acoustic waves of half the wavelength or twice the frequency as that of the input transducer. This corresponds to a purpose of feeding signals from source 10 to transducer 12 of frequency $f_o$ while at the same time applying output signals to load 15 of $2f_o$. That is, the device of FIG. 1 functions not only linearly as a SWIF but also non-linearly to perform the function of a frequency doubler.

To the end, then, of achieving active interaction in the device of FIG. 1, the piezoelectric material has a portion, in this case that portion upon which input transducer 12 is coupled, which also exhibits non-linearity of interaction between stress components within the piezoelectric medium and associated electric field components developed by the electrodes of transducer 12. Input transducer 12 then responds to an electrical signal of given frequency from source 10 to develop in the medium of substrate 12 electric fields that create associated non-linearly related stress components in the form of acoustic-wave energy. By reason of this non-linearity of interaction, the acoustic-wave energy developed by input transducer 12 includes signal components not only at the fundamental frequency $f_o$ but also at harmonics thereof including the frequency $2f_o$. By selecting the intertooth spacing of transducer 14 to correspond to one of those harmonics, the output signal fed to load 15 is a multiple in terms of frequency of the input signal. It is for this reason that the inter-tooth spacing of transducer 14 is half that of transducer 12 so as to respond to and interact with the acoustic wave energy representing signal components at twice the input signal frequency.

While various materials may be employed to exhibit both the desired piezoelectric action and the non-linear interaction between the field and stress components, the so-called piezoelectric ceramics are illustrative and useful provided that the power levels fed to the input transducer are not excessive. When poled, such ceramics exhibit a linear interaction between the field and stress components, the same as when using a natural piezoelectric material like quartz. In FIG. 1, therefore, the output portion 17 of substrate 13 is poled. In this case, it is poled in a direction perpendicular to the wave-propagating surface, and waves arriving from a direction perpendicular to the teeth of transducer 14 interact with the teeth of that transducer in the now well-known manner for developing the output signal. Accordingly, output portion 17 is denominated in FIG. 1 with the letter *p*. On the other hand, input portion 18, not being poled, is denominated with the letters *n-p* in FIG. 1. When not poled, the desired non-linearity is achieved.

More particularly, the ceramic of the substrate is ferroelectric. It must be poled in order to function in a linear manner. When not poled, it behaves non-linearly. In operation, the applied input signal is then caused to have a sufficient amplitude to pole and depole the ceramic only instantaneously at a rate defined by the frequency of the input signal. For the illustrated interdigital transducer, the peak amplitude of the input signal divided by the inter-tooth spacing equals or exceeds the voltage level that would be required to fixedly pole the ceramic. Using PZT for the substrate, a peak amplitude of fifty volts per mil of thickness is sufficient. Moreover, the orientation of the transducer on the non-poled portion should be parallel to the transducer properly oriented on the poled portion. In addition, the line of demarcation between the poled and non-poled portions should be normal to the direction of propagation of the acoustic surface waves, and the demarcation should be well defined and rectilinear.

Figure 2:
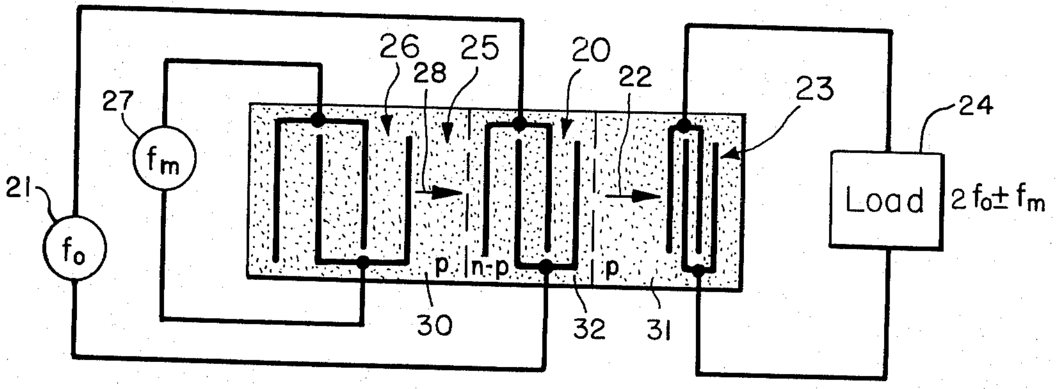
FIG. 2 is a partly schematic plan view of a different embodiment of an acoustic-wave signal-translating device.

Thus, the portion of the ceramic substrate below transducer 12 is "poled" periodically in response to an input signal $f_o$. This produces stress components at $2f_o$. When these stress components match those associated with the acoustic surface-wave mode, efficient transduction of energy in output transducer 14 is achieved at the frequency $2f_o$. Extending this principle of operation, a non-linear interaction region is included in the device of FIG. 2 for the purposes of enabling modulation of an input signal carrier. To this end, an input transducer 20 responds to signals of frequency $f_o$ from a signal source 21 to develop acoustic wave energy indicated by an arrow 22 that travels to and interacts with an output transducer 23 for developing output signals that, in turn, are fed to a load 24. As in FIG. 1, input and output transducers 20 and 23 have different inter-tooth spacing so that the output transducer responds at the frequency $2f_o$.

Disposed on the same surface of the piezoelectric substrate 25 as the other two transducers is a third transducer 26 which responds to lower-frequency modulation signals of frequency $f_m$ developed by a source 27 to create acoustic waves indicated by the arrow 28 that travel toward the first input transducer 20. Both the second input transducer 26 and the output transducer 23 are disposed on respective portions 30 and 31 of substrate 25 that are poled so as to exhibit linear interaction between stress components within the substrate and electric field components associated with the transducers. On the other hand, the central portion 32, to which the first input transducer 20 is coupled, is not poled so that the interaction between the stress components and the electric field components is non-linear. As a result of the non-linearity in portion 32, the carrier signal from source 21 is non-linearly related with the acoustic wave energy it develops within substrate 25 by way of transducer 20. At the same time, the acoustic waves arriving at transducer 20 from transducer 26 create additional stress components in region 32 and these piezoelectrically develop their own modulating-signal-representative electric field components. The two different sets of electric field components, respectively representing a signal twice the frequency of the carrier signal and the modulating signal, add and subtract within portion 32 so that the composite acoustic wave energy that is propagated to output transducer 23 represents a modulation of the signal from source 27 upon the frequency-doubled carrier signal from source 21. The action is analogous to the modulation of one signal upon another in a vacuum tube or transistor by non-linearly modulating a stream of charge carriers with two different signals. In consequence, the output signal fed to load 24 from transducer 23 contains the doubled-frequency carrier signal together with upper and lower sidebands. The output signal, therefore, is represented by the familiar expression $2f_o \pm f_m$.

Figure 3:
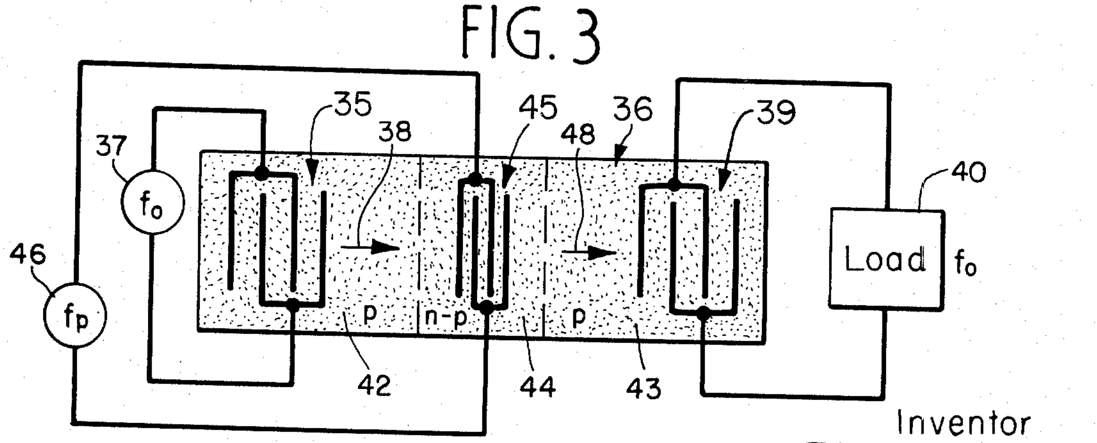
FIG. 3 is a partly schematic plan view of still another embodiment of such a device.

In order to obtain active amplification, the wave device is restructured as shown in FIG. 3 to obtain parametric interaction. In this embodiment, a first input transducer 35 disposed on a substrate 36 responds to signals from an input signal source 37 to launch acoustic waves represented by the arrow 38. As illustrated, these waves travel to the right and ultimately interact with an output transducer 39 which develops an output signal that is fed to a load 40. Input and output transducers 35 and 39 have the same inter-tooth spacing optimized to interact efficiently at the frequency $f_o$ of the signals from source 37. Moreover, transducers 35 and 39 are each coupled to respective portions 42 and 43 of substrate 36 that are poled. Consequently, the interaction between the stress components in the propagating medium and the electric fields in these two transducers is linear. By themselves, then, the portions of the device of FIG. 3 thus far described operate as a conventional SWIF.

Disposed on the intermediate portion 44 of substrate 36 is another input transducer 45 which is coupled across a pump signal source 46. Moreover, portion 44 is not poled so that the pump signals create electric fields within the propagating medium of portion 44 that exhibit non-linearity of interaction with the piezoelectric stress components in the medium. At the same time, the acoustic-wave energy launched by input transducer 35 produces stress components in portion 44 that are non-linearly related to the electric field components they create in portion 44. Consequently, there exist within portion 44 input-signal-representative acoustic-wave energy that travels alongside pump-signal-representative acoustic-waves launched by transducer 45. By reason of the non-linearity in portion 44, the respective field components interact. When the pump-signal-representative field components exhibit a frequency, as "seen" by the input-signal representative field components, that is twice the frequency of the latter and of appropriate phase, energy is parametrically delivered from the pump components to the signal components and the latter are thereby amplified. Consequently, the acoustic wave energy, indicated by arrow 48, which arrives at transducer 39 with a wavelength appropriate for interaction with that transducer has been amplified. Thus, the signal fed to load 40 is an amplified version of the original input signal from source 37. Of course, it is desirable to minimize all possible transmission loss.

Several different acoustic-wave signal translating devices have been disclosed in each of which both non-linear and linear interaction are involved. In consequence, the acoustic wave devices function not only as filter and/or delay lines but also as frequency multipliers, modulators and/or amplifiers. Although no active elements, such as transistors, are employed, the devices function in the manner of an active element.

While particular embodiments of the present invention have been shown and described, it will be obvious to those skilled in the art that changes and modifications may be made without departing from the invention in its broader aspects. Accordingly, the aim in the appended claims is to cover all such changes and modifications as fall within the true spirit and scope of the invention.

I claim:

1. An acoustic-wave signal-translating device comprising:

a medium propagative of acoustic surface waves and including a first portion exhibiting non-linearity of interaction between stress components and associated electric field components and a second portion exhibiting linearity of interaction between stress components and associated electric field components;

an input transducer responsive to an electric signal of predetermined frequency and coupled to said first portion for developing electric fields in said medium that create associated non-linearly related stress components in the form of acoustic surface waves;

and an output transducer coupled to said second portion of said medium and responsive to electric fields generated by associated linearly-related stress components produced by said acoustic waves for developing an output signal.

2. A translating device as defined in claim 1 in which said acoustic surface waves include a component harmonically related to said predetermined frequency and in which said output transducer develops output signals of the frequency of said harmonic component.

3. A translating device as defined in claim 2 in which said harmonic component has a frequency that is double that of said predetermined frequency.

4. A translating device as defined in claim 1 in which said first portion of said medium is non-poled and in which said second portion, to which said output transducer is coupled, is poled.

5. An acoustic-wave signal-translating device comprising:

a medium propagative of acoustic surface waves and including a first portion exhibiting non-linearity of interaction between stress components and associated electric field components and a second portion exhibiting linearity of interaction between stress components and associated electric field components;

a first transducer coupled to one of said portions and responsive to an applied electric signal for developing electric fields in said medium that create stress components in the form of acoustic surface waves;

and a second transducer coupled to the other of said portions and responsive to electric fields generated by stress components produced by said acoustic waves for developing an output signal.

6. A translating device as defined in claim 1 which further includes a second input transducer that responds to a second input signal for launching additional acoustic waves in said medium that effectively interact with the first-mentioned acoustic waves.

7. A translating device as defined in claim 6 in which signal components represented by said additional acoustic waves are modulated upon said first-mentioned acoustic waves and said output transducer developing a correspondingly modulated output signal.

8. A translating device as defined in claim 6 in which both said second input transducer and said output transducer interact with electric fields linearly related with associated stress components in said medium.

9. A translating device as defined in claim 6 in which said second input signal has a frequency lower than said predetermined frequency and said output signal has a frequency twice that of the first input signal.

10. A translating device as defined in claim 6 in which said first-mentioned acoustic waves parametrically interact with said additional acoustic waves and said output transducer responds to an amplified level of acoustic wave energy.

11. An acoustic-wave signal-translating device comprising:

a ferroelectric ceramic medium propagative of acoustic surface waves and including a first non-poled portion exhibiting non-linearity of interaction between stress components and associated electric field components and a second poled portion exhibiting linearity of interaction between stress components and associated electric field components, said first and second portions of said medium demarcated by a rectilinear demarcation line;

an input transducer coupled to said first portion of said medium and responsive to an electric signal of predetermined frequency and of sufficient magnitude to alternately pole and depole said first portion of said medium for developing electric fields in said medium that create associated non-linearly related stress components in the form of acoustic surface waves, said input transducer and said medium being arranged to cause said acoustic waves to propagate in a direction normal to said demarcation line;

and an output transducer coupled to said second portion of said medium and responsive to electric fields generated by associated linearly-related stress components produced by said acoustic waves for developing an output signal.

12. A translating device as defined in claim 11 in which said acoustic surface waves include a component harmonically related to said predetermined frequency and in which said output transducer develops output signals of the frequency of said harmonic component.

13. A translating device as defined in claim 12 in which said harmonic component has a frequency that is double that of said predetermined frequency.

14. A translating device as defined in claim 11 which further includes a second input transducer that responds to a second input signal for launching additional acoustic waves in said medium that effectively interact with the first-mentioned acoustic waves.

15. A translating device as defined in claim 14 in which signal components represented by said additional acoustic waves are modulated upon said first-mentioned acoustic waves and said output transducer developing a correspondingly modulated output signal.

16. A translating device as defined in claim 14 in which both said second input transducer and said output transducer interact with electric fields linearly related with associated stress components in said medium.

17. A translating device as defined in claim 14 in which said second input signal has a frequency lower than said predetermined frequency and said output signal has a frequency twice that of the first input signal.

18. A translating device as defined in claim 14 in which said first-mentioned acoustic waves parametrically interact with said additional acoustic waves and said output transducer responds to an amplified level of acoustic wave energy.

* * * * *